(12) United States Patent
Case et al.

(10) Patent No.: US 6,546,172 B2
(45) Date of Patent: Apr. 8, 2003

(54) OPTICAL DEVICE

(75) Inventors: Steven K. Case, St. Louis Park, MN (US); Gregory S. Mowry, Burnsville, MN (US); Timothy A. Skunes, Mahtomedi, MN (US)

(73) Assignee: Avanti Optics Corporation, Minneapolis, MN (US)

( * ) Notice: Subject to any disclaimer, the term of this patent is extended or adjusted under 35 U.S.C. 154(b) by 0 days.

(21) Appl. No.: 09/789,124

(22) Filed: Feb. 20, 2001

(65) Prior Publication Data

US 2002/0114579 A1 Aug. 22, 2002

(51) Int. Cl.$^7$ .................................... G02B 6/26
(52) U.S. Cl. ........................................... 385/52
(58) Field of Search ............................. 385/52, 51, 39

(56) References Cited

U.S. PATENT DOCUMENTS

| | | | |
|---|---|---|---|
| 4,250,520 A | 2/1981 | Denlinger | 357/68 |
| 4,457,467 A | 7/1984 | Klement et al. | 228/103 |
| 4,708,429 A | 11/1987 | Clark et al. | 350/96.2 |
| 4,720,163 A | 1/1988 | Goodwin et al. | 350/96.2 |
| 4,730,198 A | 3/1988 | Brown et al. | 350/96.2 |
| 4,750,799 A | 6/1988 | Kawachi et al. | 350/96.11 |
| 4,752,816 A | 6/1988 | Sussman et al. | 357/30 |
| 4,790,618 A | 12/1988 | Abe | 350/96.15 |

(List continued on next page.)

FOREIGN PATENT DOCUMENTS

| | | |
|---|---|---|
| DE | 196 44 758 A1 | 4/1998 |
| EP | 0 840 154 A1 | 5/1998 |
| EP | 0 977 061 A2 | 2/2000 |
| FR | 2 779 536 | 12/1999 |
| JP | 54-12286 | 1/1979 |
| JP | 62-276890 | 12/1987 |
| JP | 63-12187 | 1/1988 |
| JP | 63-65411 | 3/1988 |
| JP | 63-193113 | 8/1988 |
| JP | 63-228113 | 9/1988 |
| JP | 1-302214 | 12/1989 |
| JP | 6-34852 | 2/1994 |
| JP | 6-174943 | 6/1994 |
| JP | 6-201921 | 7/1994 |
| JP | 6-331840 | 12/1994 |
| JP | 7-333472 | 12/1995 |
| JP | 61-277908 | 12/1996 |

OTHER PUBLICATIONS

U.S. patent application Ser. No. 09/894,872, filed Jun. 27, 2001, entitled "Automated Opto–Electronic Assembly Machine and Method".

Article from Web Site entitled "The Photonics Program and the Engineering Research Division at LLNL are Automating the Packaging of Optoelectronic Devices to Lower Costs", 3 pages, downloaded Oct. 19, 2000.

Article from Web Site entitled "Automated Optoelectronic Packaging", 2 pages, downloaded Feb. 5, 2001.

Article from Web Site entitled "Micro Assembly Automation", 3 pages., downloaded Feb. 5, 2001.

"Micro–Mechanical Alignment Structures (patent pending)", from Web Site of Axsun Technologies, 2 pages, downloaded Feb. 15, 2001.

"An Innovative Flexible and Accurate Packaging Technique Suited to Fabricate Low Cost Micro Optoelectronic Modules", by M. Scussat et al., *Electronic Components and Technology Conference*, 2000, pp. 26–32.

*Primary Examiner*—Tulsidas Patel
(74) *Attorney, Agent, or Firm*—Westman, Champlin & Kelly, P.A.

(57) ABSTRACT

An optical device is provided which includes a plurality of optical modules. Each optical module includes an optical component fixedly coupled to a relative reference mount. The relative reference mount is configured to attach to a substrate. A plurality of optical modules mount on the substrate to form the optical device.

80 Claims, 14 Drawing Sheets

U.S. PATENT DOCUMENTS

| | | | |
|---|---|---|---|
| 4,798,439 A | 1/1989 | Preston ..................... 350/96.2 |
| 4,817,849 A | 4/1989 | Yamamoto et al. ......... 228/103 |
| 4,845,052 A | 7/1989 | Abend ........................ 437/209 |
| 4,854,667 A | 8/1989 | Ebata et al. ............... 350/96.2 |
| 4,892,377 A | 1/1990 | Randle ...................... 350/96.2 |
| 4,909,590 A | 3/1990 | Kamiko et al. .......... 350/96.22 |
| 4,954,458 A | 9/1990 | Reid ............................. 437/51 |
| 4,989,934 A | 2/1991 | Zavracky et al. ........ 350/96.11 |
| 5,093,879 A | 3/1992 | Bregman et al. ............. 385/93 |
| 5,113,404 A | 5/1992 | Gaebe et al. ................. 372/36 |
| 5,123,074 A | 6/1992 | Yokota et al. ................ 385/95 |
| 5,170,455 A | 12/1992 | Gooseen et al. ............. 385/89 |
| 5,177,807 A | 1/1993 | Avelange et al. ............ 385/91 |
| 5,210,811 A | 5/1993 | Avelange et al. ............ 385/91 |
| 5,215,489 A | 6/1993 | Nakamura ..................... 445/4 |
| 5,216,729 A | 6/1993 | Berger et al. ................. 385/31 |
| 5,247,597 A | 9/1993 | Blacha et al. ................ 385/88 |
| 5,249,733 A | 10/1993 | Brady et al. ........... 228/180.22 |
| 5,283,446 A | 2/1994 | Tanisawa .................... 257/433 |
| 5,322,463 A | 6/1994 | Young ........................... 445/4 |
| 5,371,822 A | 12/1994 | Horwitz et al. .............. 385/89 |
| 5,383,118 A | 1/1995 | Nguyen ................. 364/167.01 |
| 5,450,508 A | 9/1995 | Decusatis et al. ............ 385/25 |
| 5,478,778 A | 12/1995 | Tanisawa .................... 437/183 |
| 5,499,312 A | 3/1996 | Hahn et al. ................... 385/91 |
| 5,535,296 A | 7/1996 | Uchida ......................... 385/89 |
| 5,550,088 A | 8/1996 | Dautartas et al. ........... 437/225 |
| 5,555,333 A | 9/1996 | Kato ............................. 385/89 |
| 5,559,914 A | 9/1996 | Asakura ....................... 385/49 |
| 5,568,892 A | 10/1996 | Basavanhally ......... 228/180.22 |
| 5,570,184 A | 10/1996 | Armington et al. ......... 356/375 |
| 5,574,561 A | 11/1996 | Boudreau et al. ........... 356/399 |
| 5,603,870 A | 2/1997 | Roll et al. .................. 264/1.25 |
| 5,625,733 A | 4/1997 | Frigo et al. ................... 385/88 |
| 5,644,668 A | 7/1997 | Chambers et al. ........... 385/90 |
| 5,647,044 A | 7/1997 | Basavanhally et al. ....... 385/92 |
| 5,659,641 A | 8/1997 | DeMeritt et al. ............. 385/14 |
| 5,671,315 A | 9/1997 | Tabuchi et al. ............. 385/137 |
| 5,677,973 A | 10/1997 | Yuhara et al. ................ 385/90 |
| 5,687,267 A | 11/1997 | Uchida ......................... 385/89 |
| 5,700,987 A | 12/1997 | Basavanhally ............. 219/56.1 |
| 5,721,797 A | 2/1998 | Basavanhally et al. ....... 385/49 |
| 5,737,467 A | 4/1998 | Kato et al. .................... 385/92 |
| 5,745,624 A | 4/1998 | Chan et al. ................... 385/91 |
| 5,748,822 A | 5/1998 | Miura et al. .................. 385/90 |
| 5,748,827 A | 5/1998 | Holl et al. ................... 385/134 |
| 5,778,120 A | 7/1998 | Asakura et al. ............... 385/49 |
| 5,833,202 A | 11/1998 | Wolfgang .................... 248/466 |
| 5,854,867 A | 12/1998 | Lee et al. ...................... 385/49 |
| 5,859,943 A | 1/1999 | Asakura et al. ............... 385/49 |
| 5,883,988 A | 3/1999 | Yamamoto et al ............ 385/14 |
| 5,892,179 A | 4/1999 | Rinne et al. ................. 174/261 |
| 5,894,657 A | 4/1999 | Kanayama et al. ........... 29/740 |
| 5,898,806 A | 4/1999 | Nishimoto .................... 385/49 |
| 5,907,649 A | 5/1999 | Acklin et al. ................. 385/49 |
| 5,916,458 A | 6/1999 | Komoriya et al. ..... 219/121.63 |
| 5,966,486 A | 10/1999 | Boudreau et al. ............. 385/90 |
| 5,970,200 A | 10/1999 | Takikawa et al. ........... 385/137 |
| 5,985,086 A | 11/1999 | Peall .......................... 156/292 |
| 6,010,251 A | 1/2000 | Koyanagi et al. ............. 385/93 |
| 6,027,253 A | 2/2000 | Ota et al. ...................... 385/83 |
| 6,027,254 A | 2/2000 | Yamada et al. ............... 385/88 |
| 6,058,234 A | 2/2000 | Tachigori ...................... 385/49 |
| 6,074,103 A | 6/2000 | Hargreaves et al. .......... 385/90 |
| 6,106,161 A | 8/2000 | Basavanhally et al. ....... 385/88 |
| 6,112,001 A | 8/2000 | Kishida et al. ................ 385/49 |
| 6,115,515 A | 9/2000 | Itoh et al. ...................... 385/14 |
| 6,118,917 A | 9/2000 | Lee et al. ...................... 385/49 |
| 6,155,515 A | 9/2000 | Itoh et al. ...................... 285/14 |
| 6,130,448 A | 10/2000 | Bauer et al. ................. 257/222 |
| 6,132,106 A | 10/2000 | Yokoyama .................... 385/74 |
| 6,148,511 A | 11/2000 | Taguchi ........................ 29/834 |
| 6,151,173 A | 11/2000 | Massit et al. ................ 359/811 |
| 6,157,050 A | 12/2000 | Fukuoka ....................... 257/82 |
| 6,160,936 A | 12/2000 | You et al. ...................... 385/49 |
| 6,164,837 A | 12/2000 | Haake et al. .................. 385/90 |
| 6,222,579 B1 | 4/2001 | Sousa ......................... 347/241 |
| 6,327,407 B1 | 12/2001 | Mitsuda et al. ............... 385/49 |
| 2001/0010743 A1 | 8/2001 | Cayrefoureq et al. ......... 385/88 |

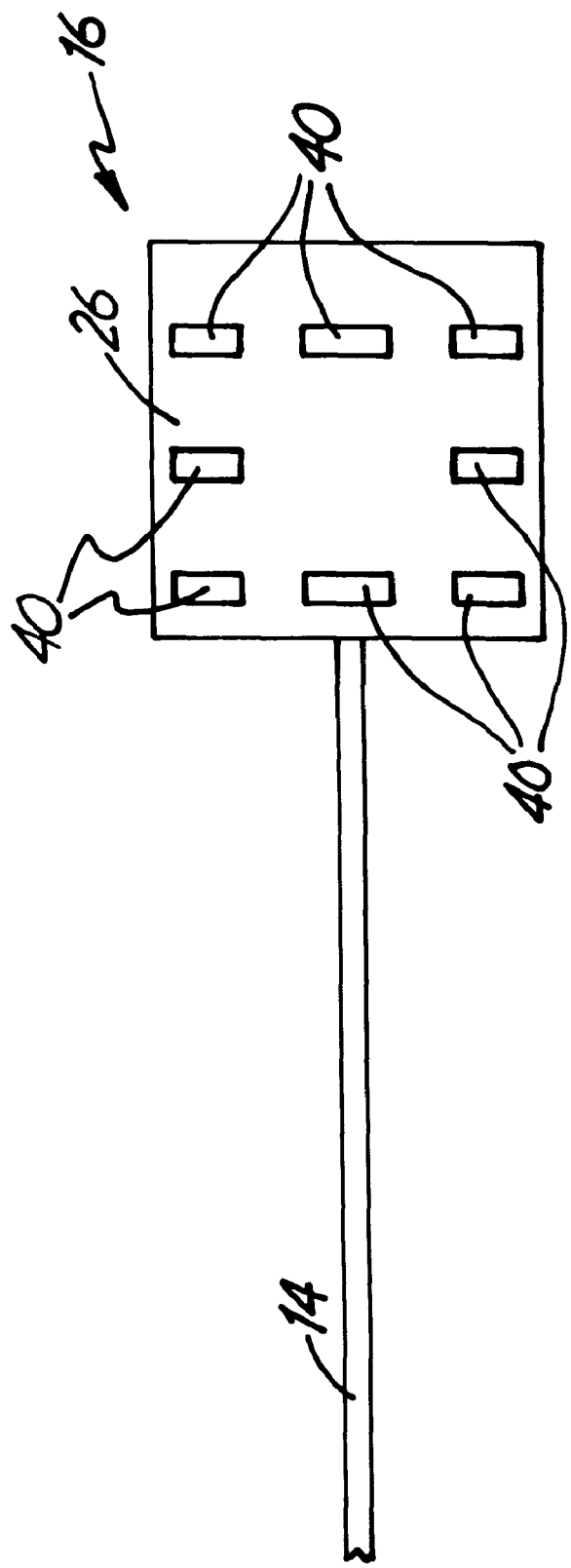

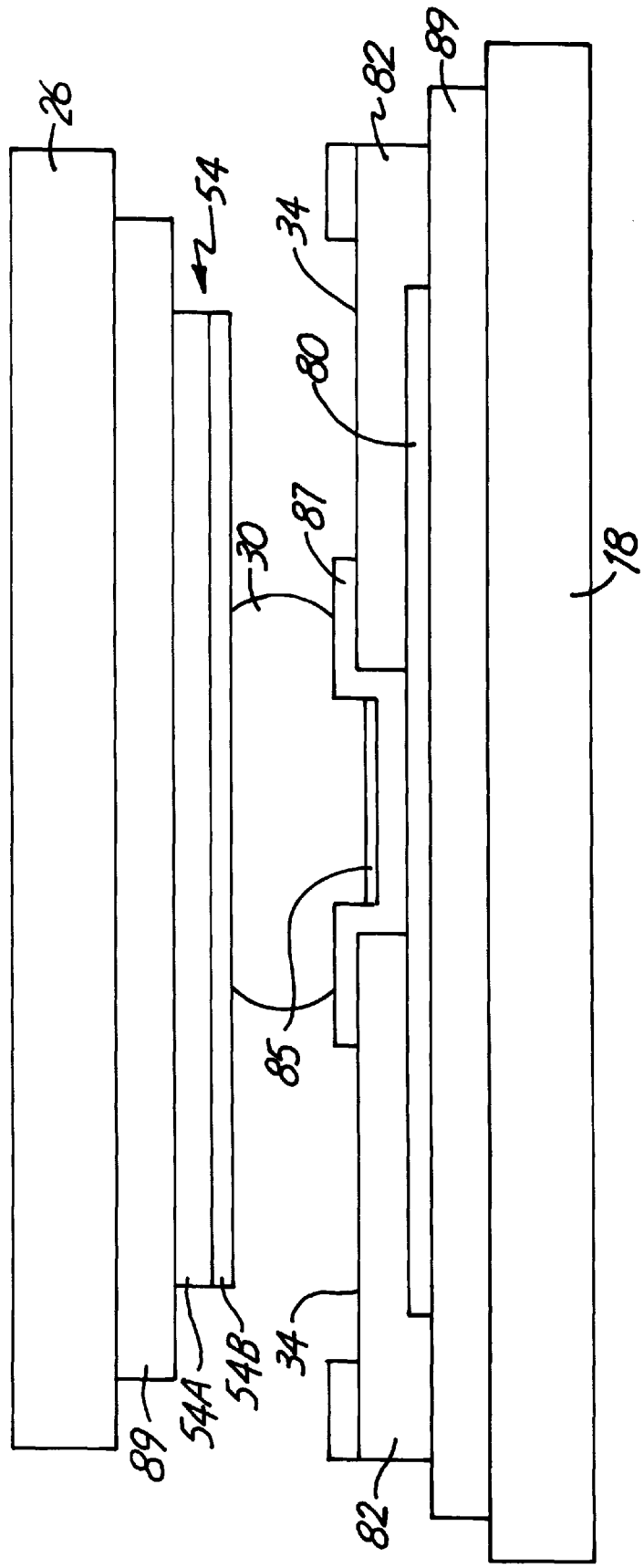

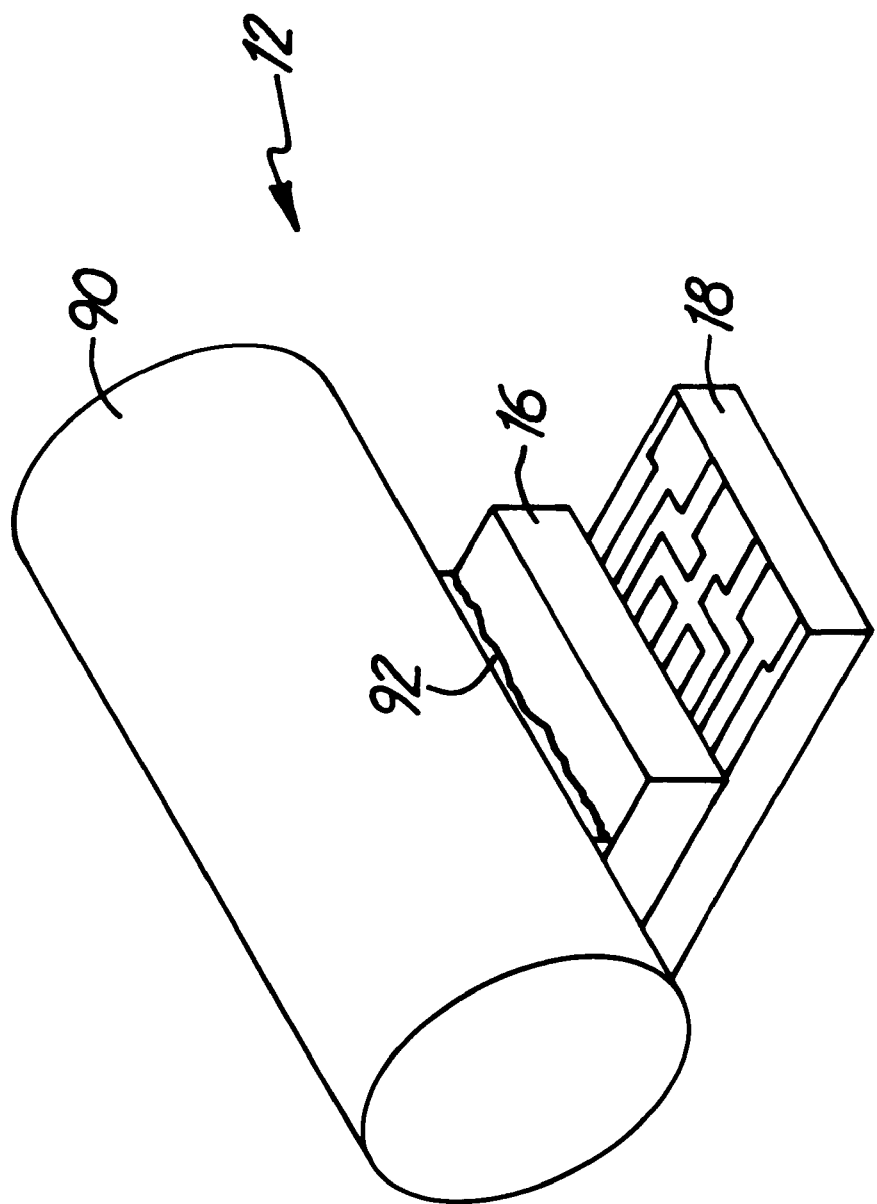

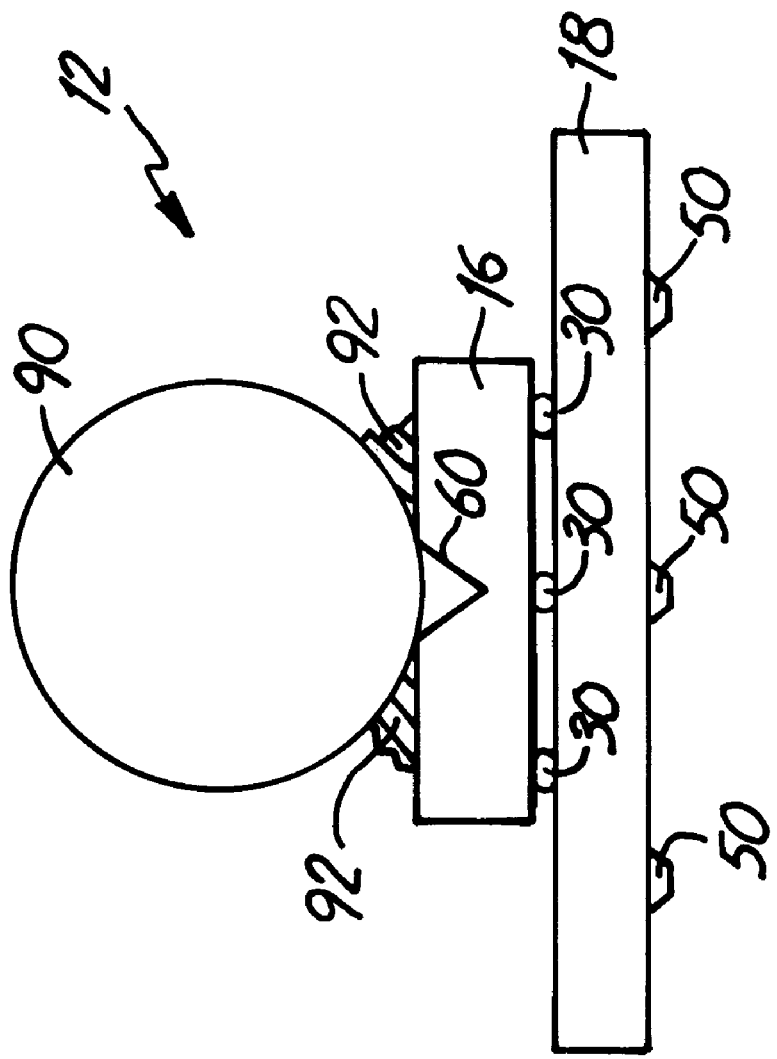

OPTICAL DEVICE

This application is related to co-pending application Ser. No. 09/789,125, filed Feb. 20, 2001 and entitled "OPTICAL MODULE"; application Ser. No. 09/789,185, filed Feb. 20, 2001 and entitled "OPTICAL MODULE WITH SOLDER BOND"; and application Ser. No. 09/789,317, filed Feb. 20, 2001 and entitled "OPTICAL ALIGNMENT SYSTEM", the contents of which are hereby incorporated by reference in their entirety.

BACKGROUND OF THE INVENTION

The present invention relates to optical components and optical devices fabricated from such components. More specifically, the present invention relates to an optical device formed by a plurality of optical modules which carry optical, optical-electrical or optical-mechanic components.

Optical devices are being increasingly used in various industries and technologies in order to provide high speed data transfer such as a fiber optic communication equipment. In many applications there is a transition or an incorporation of optical devices where previously only electrical devices were employed. An optical device typically consists of a number of components which must be precisely assembled and aligned for the device to operate and function efficiently. Example components include fibers, waveguides, lasers, modulators, detectors, gratings, optical amplifiers, lenses, mirrors, prisms, windows, etc.

Historically, optical devices such as those used in fiber optic telecommunications, data storage and retrieval, optical inspection, etc. have had little commonality in packaging and assembly methods. This limits the applicability of automation equipment for automating the manufacture of these devices since there is such a disparity in the device designs. To affect high volume automated manufacturing of such devices, parts of each individual manufacturing line have to be custom-designed.

In contrast, industries such as printed circuit board manufacturing and semiconductor manufacturing have both evolved to have common design rules and packaging methods. This allows the same piece of automation equipment to be applied to a multitude of designs. Using printed circuits as an example, diverse applications ranging from computer motherboards to cellular telephones may be designed from relatively the same set of fundamental building blocks. These building blocks include printed circuit boards, integrated circuit chips, discrete capacitors, and so forth. Furthermore, the same automation equipment, such as a pick and place machine, is adaptable to the assembly of each of these designs because they use common components and design rules.

Further complications arise in automated assembly of optical devices. Such assembly is complicated because of the precise mechanical alignment requirements of optical components. This adds to problems which arise due to design variations. The problem arises from the fact that many characteristics of optical components cannot be economically controlled to exacting tolerances. Examples of these properties include the fiber core concentricity with respect to the cladding, the location of the optical axis of a lens with respect to its outside mechanical dimensions, the back focal position of a lens, the spectral characteristics of a thin-film interference filter, etc. Even if the mechanical mounting of each optical element were such that each element was located in its exact theoretical design position, due to the tolerances listed above, the performance specifications of the optical device may not be met.

To appreciate the exacting alignment requirements of high performance optical devices, consider the simple example of aligning two single mode optical fibers. In this example, the following mechanical alignments are required to ensure adequate light coupling from one fiber to the other: the angle of the fibers with respect to each other, the fiber face angle, the transverse alignment (perpendicular to the light propagation direction) and the longitudinal spacing (parallel to the light propagation direction).

Typical single mode optical fibers used in telecommunications for the 1.3 $\mu$m to 1.6 $\mu$m wavelength range have an effective core diameter of about 9 microns and an outside cladding dimension of 125 microns. The typical tolerance for the concentricity of the core to the outside diameter of the cladding is 1 micron. If the outside claddings of the two fibers were perfectly aligned and there is no angular misalignment or longitudinal spacing, the cores may still be transversely misaligned by as much as 2 microns. This misalignment would give a theoretical coupling loss of about 14 percent or 0.65 dB. This loss is unacceptable in many applications. It would be desirable to provide an optical device which addresses some of the deficiencies of the prior art.

SUMMARY OF THE INVENTION

In one example aspect, an optical device is provided which comprises a plurality of optical modules. Each optical module includes an optical component to operably couple to a relative reference mount. The relative reference is configured to couple to a fixed reference mount. A plurality of optical modules mounted on the fixed reference mount form the optical device.

BRIEF DESCRIPTION OF THE DRAWINGS

FIG. 2B is a bottom plan view of a component mount.

FIG. 8B is a side cross-sectional view showing the bonding material of FIG. 8A.

FIG. 9 is a perspective view showing an optical module of the present invention which includes a Gradient Index (GRIN) lens.

FIG. 10 is a front plan view of the optical module of FIG. 9.

DETAILED DESCRIPTION OF THE PREFERRED EMBODIMENTS

The present invention includes various aspects that reduce or eliminate many of the problems associated with the prior art. The present invention offers an optical device fabricated from optical modules which are prealigned in standardized optical modules. Each optical module can be aligned with sub-micron precision with respect to registration features. Registration features on a module can be aligned with matching features on a substrate. This is similar to mounting an electrical component in or on a printed circuit board. Optical devices can be easily fabricated by mounting prealigned optical modules in the optical "circuit board". The prealignment of the optical module can compensate for variations between components to thereby essentially eliminate the effects of component variability. The prealigned optical modules are well suited for automated fabrication of devices. The modules can be fabricated in silicon using techniques which are well known in the art of silicon processing. However, any appropriate material can be used. Preferable materials are those which are used with existing electrical or optical components. Further, the invention can be used with active devices such as lasers, modulators, detectors, etc. Electrical conductors can be fabricated on the various layers for coupling to active optical components. Electrical circuitry including analog and digital circuitry can also be fabricated directly on the modules or on the fixed reference mount.

In one aspect, the present invention provides an optical device formed from at least two optical modules in which optical components are mounted to optical component mounts. The optical component mount is fixed to a relative reference mount such as a base mounting plate at a desired position and orientation. The relative reference mount is coupled to a fixed reference mount such as a substrate such that the optical component is maintained at a desired position and orientation relative to the fixed reference mount. In this general configuration, the optical component can be pre-aligned to a desired spacial reference and orientation by adjusting the optical component mount relative to the reference mount prior to fixing their relative positions. This can be used to provide general component pre-alignment as well as compensate for the variations which can arise between optical components. The following description sets forth a number of specific examples, however, in various aspects, the present invention is not limited to the specific configurations, components or techniques set forth herein.

Figure 1:
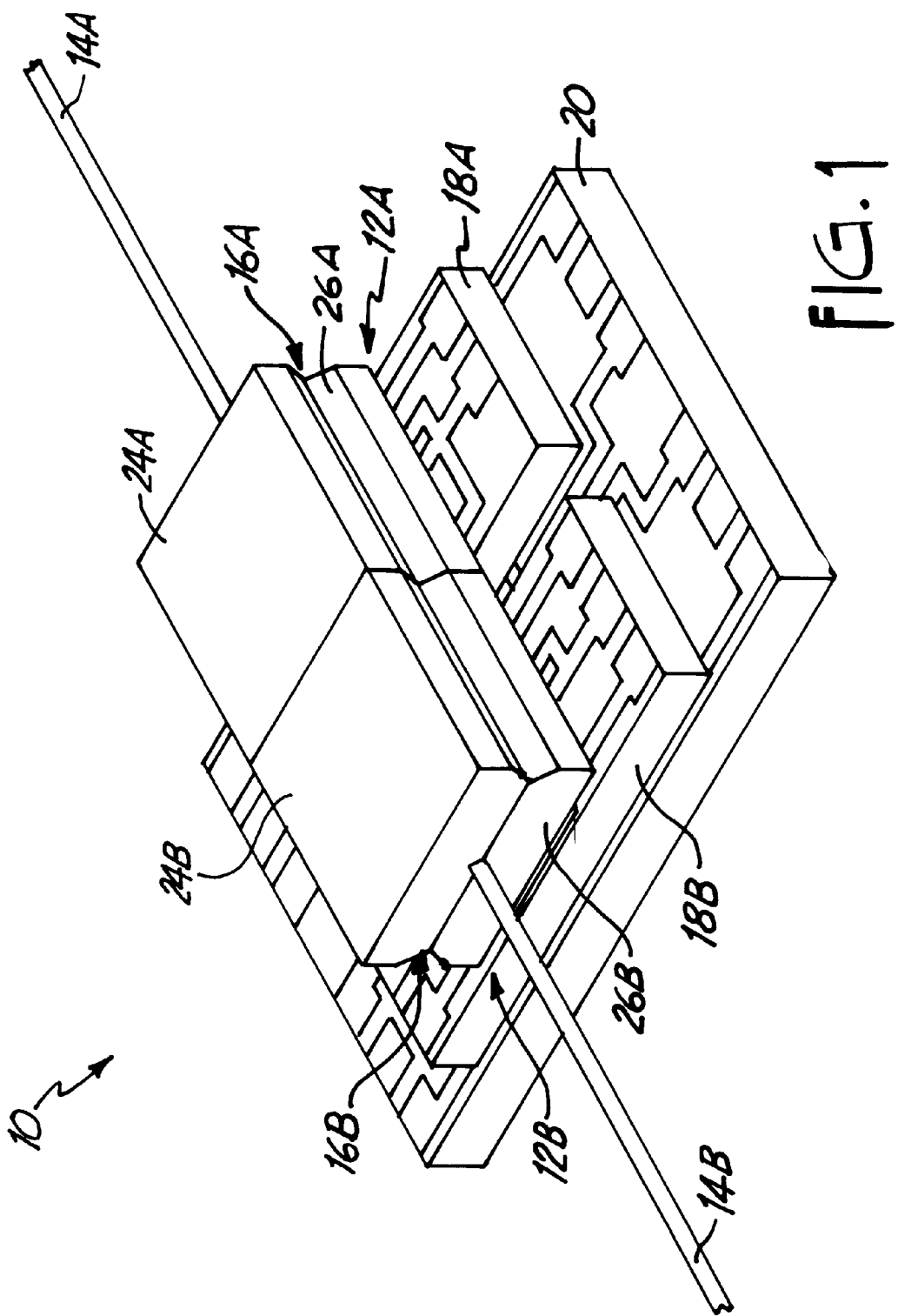
FIG. 1 is a perspective view of an optical device in accordance with one example embodiment of the present invention.

FIG. 1 is a perspective view of an optical device 10. Optical device 10 is shown as a simple optical fiber to optical fiber coupler for purposes of illustrating the present invention. However, the invention is applicable to more complex or other optical devices and other types of optical components.

In FIG. 1, the optical device 10 is fabricated from two optical modules 12A and 12B which include respective optical components 14A and 14B illustrated in this specific example as optical fibers. The fibers are mounted to respective optical component mounts 16A and 16B which are positioned and oriented to achieve a desired position and orientation of optical components 14A and 14B relative to base mounting plates 18A and 18B, respectively. A number of specific examples of this coupling are set forth below in more detail, however, other aspects of the invention are not limited to such examples. In the example illustrations specifically set forth in FIG. 1, base mounting plates 18A and 18B comprise substantially planar mating plates. Base mounting plates 18A, 18B are one example of a relative reference mount. The relative reference mount can have any shape or configuration. Base mounting plates 18A and 18B mount to reference substrate 20 such that the optical components 14A and 14B are in substantial alignment. Substrate 20 is one example of a fixed reference mount and any appropriate fixed reference mount with an appropriate shape and configuration can be used. The optical component modules of the present invention can be pre-assembled and pre-aligned to an appropriate reference such that a final optical device is fabricated by simply mounting the assembled optical modules on the reference substrate. In the example of FIG. 1, reference substrate 20 is illustrated as a planar substrate which can be thought of as an optical "circuit board" which receives optical modules to form an optical, opto-electrical or opto-mechanical device.

Figure 2A:
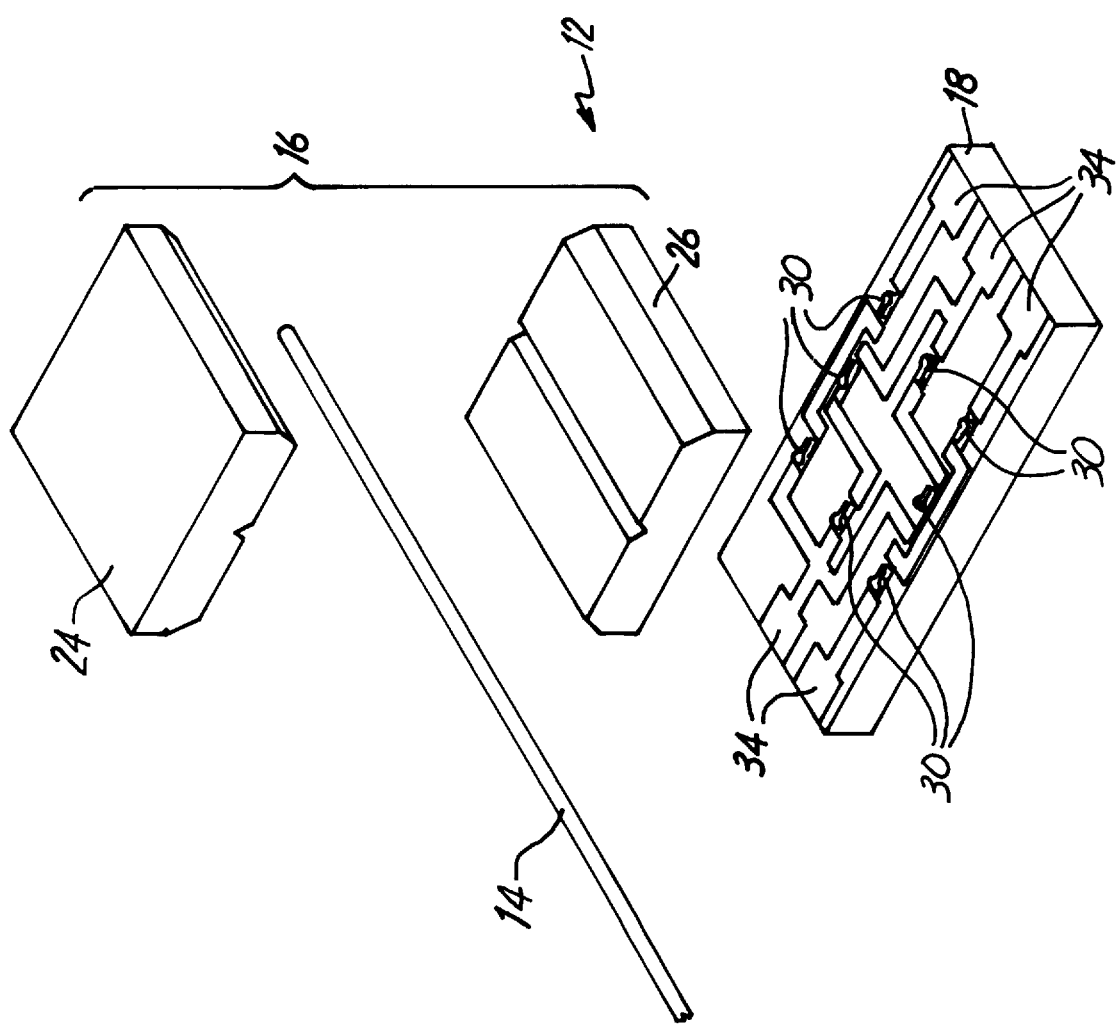
FIG. 2A is a exploded perspective view of an optical module shown in FIG. 1.

FIG. 2A is an exploded perspective view of optical module 12. In the specific example shown in FIG. 2A, optical component mount or holder 16 comprises upper component mount or holder 24 and lower component mount or holder 26. Again, other configurations are within the scope of the present invention. FIG. 2A illustrates one example mounting technique coupling optical component mount 16 to base mounting plate 18. In this example, a bonding material 30 is carried on a top surface of base mount plate 18. Material 30 preferably has at least two states. In one state, material 30 does not interfere or contact mount 16. Then, the optical component mount 16 can be positioned with up to six degrees of freedom relative to the base mounting plate 18. In another state, the material couples mounts 16 and 18 and thereby fixes the relative position therebetween. In one preferred embodiment, material 30 comprises a heat or chemically responsive (or activated) material such as solder or other bonding material. The solder can comprise any type of solder including plated solder, solder preforms, solder balls, solder paste, solder bumps, etc. including those types of solders used in flip chip electronic packages. However, other materials such as adhesives which dry, chemically react, or are activated by other means or other attachment techniques can be used. Preferably, the attachment technique allows some relative movement between the optical component mount 16 and the base mounting plate 18 prior to fixedly attaching the two. In embodiments where a heat activated material is used, heating elements (see FIG. 8B for more detail) can be provided to heat the material 30. For example, in FIG. 2A, heating elements are provided which are activated through the application of electrical energy through contact pads 34. This can be by electrically contacting pads 34 and applying a current therethrough. However, other heating techniques can be used. Of course, other techniques to change the state of bonding material can be used such as application of a curing component such as radiation or a chemical. Any appropriate adhesives including brazing, welding, bonding or other technique can be used. The bond can be activated using a technique including exposure to air, heat, chemicals, heat radiation (including light and UV), etc.

FIG. 2B is a bottom plan view of optical component mount 16 and lower mount 26 and shows bonding pads 40 which are arranged to mate with material 30 shown in FIG. 2A. Pads 40 can comprise, for example, a metal deposited on lower mount 26.

Figure 3:
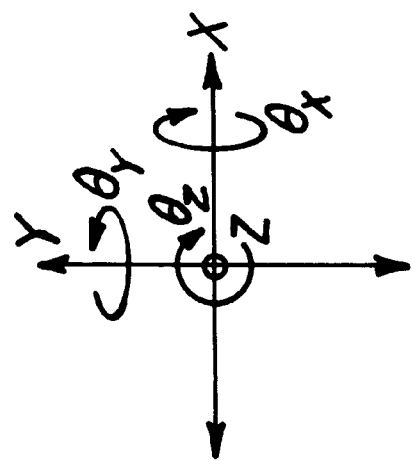
FIG. 3 is a front plan view of an optical module of FIG. 1.
Figure 3:
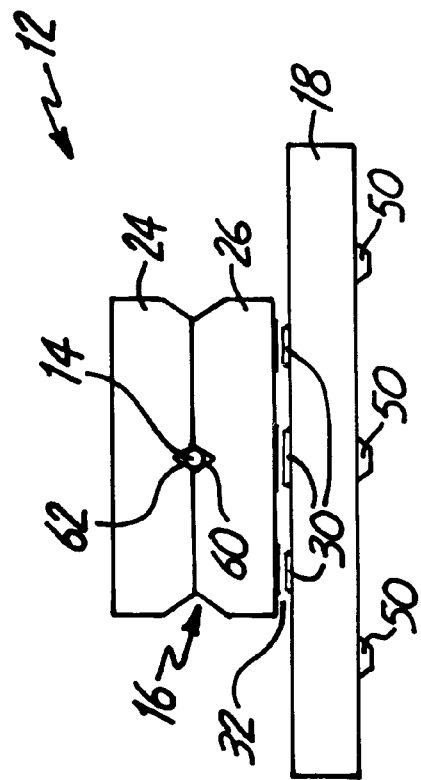

FIG. 3 is a front plan view of optical module 12 showing optical component mount 16 adjacent base mounting plate 18. In the arrangement shown in FIG. 3, material 30 is not initially in contact with optical component mount 16. As discussed below, material 30 can be activated to fill or fix the gap 32 between mount 16 and mount 18. However, other types of material 30 can be used in which there is actual contact between mounts 16 and 18 or material 30 fills gap 32 prior to bonding. In one preferred embodiment, prior to fixedly adhering mount 16 to mount 18 either component can be manipulated through up to six degrees of freedom as illustrated by the axes labeled X and Y in FIG. 3 along with another Z axis which is not shown and is perpendicular to a plane of the Figure, and rotation about the three axes. For some optical components, all six degrees of freedom may not be required for proper alignment and fewer degrees of freedom can be provided. FIG. 3 also illustrates example registration features 50. In the example embodiment of FIG. 3, each registration feature 50 is a protrusion which is configured to mate with reference substrate 20 as discussed below.

FIG. 3 also shows a component registration feature 60 formed in lower component mount 26 and a component registration feature 62 in upper component mount 24. In general, any registration technique can be used and the invention is not limited to the specific example illustrated herein. In the example embodiment, component registration features 60 and 62 comprise V-grooves which are configured to receive an optical component such as optical component 14. The optical element 14 can be coupled to the optical component mount using, for example, an adhesive or solder. Optical component 14 is preferably fixed to component mount 16 to maintain alignment relative to registration features 50 of relative reference mount 18.

Figure 4:
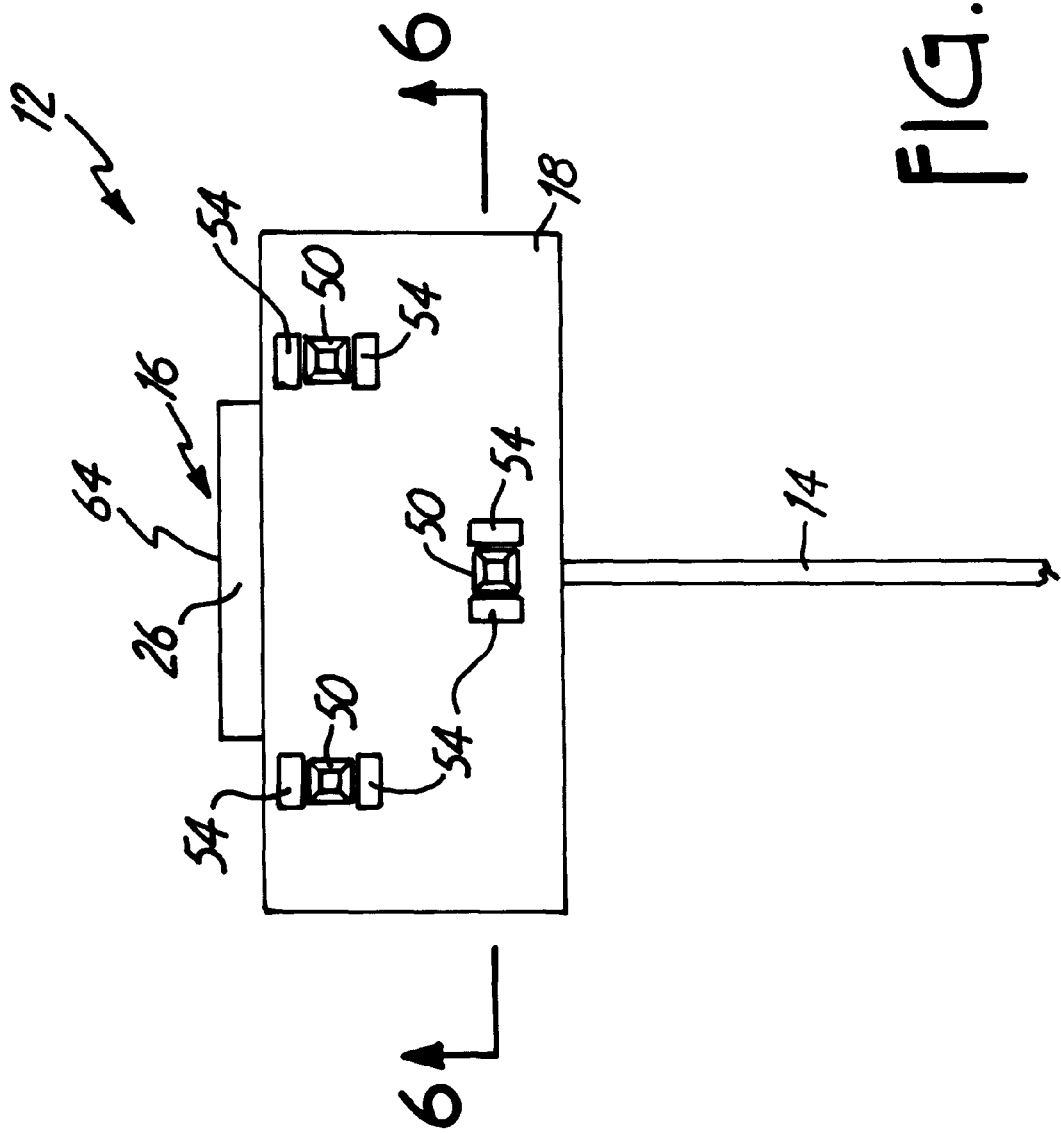
FIG. 4 is a bottom plan view of the optical module of FIG. 1.

FIG. 4 is a bottom plan view of optical module 12 which shows base mounting plate 18 and a portion of lower optical component mount 26 of optical component mount 16. Pads 54 on base mounting plate 18 can bond with bonding material 72. The bottom plan view of FIG. 4 illustrates an interface surface 64 of optical component mount 16. Interface surface 64 is an input, output or input/output face for the optical component 14 shown in FIG. 3. In some embodiments, the interface surfaces of adjacent optical modules are in abutting contact. In some embodiments, a refractive index optical matching material fills any gap between adjacent interface faces to provide improved coupling and reduce reflections. For example, the optical matching material may be in a solid, gel or liquid form. In one example embodiment, interface surface 64 is a plane which forms an angle relative to a plane perpendicular to the direction of propagation of optical fiber 14. For example, this can be eight degrees. An angled surface 64 of the optical component 14 can be preferable because it reduces the amount of reflected light which is coupled back into an optical fiber. If two modules are in close proximity or in abutting contact, the adjacent optical component mount would have a complimentary angle. In embodiments where an angle or a specific interface finish is desired, interface surface 64 can be shaped or formed using an appropriate process such as a lapping process, chemically machining, machining, etc., or an additive process, to achieve the desired configuration. For example, after the optical component 14 is secured within the optical component mount 16, the surface 64 can be lapped to achieve the desired angle or surface finish. Such techniques can also be used to ensure that a face of the optical component is flush with the interface surface 64. However, in some embodiments, it may be desirable to have the optical component 14 either recessed or protruding from interface surface 64.

Figure 5:
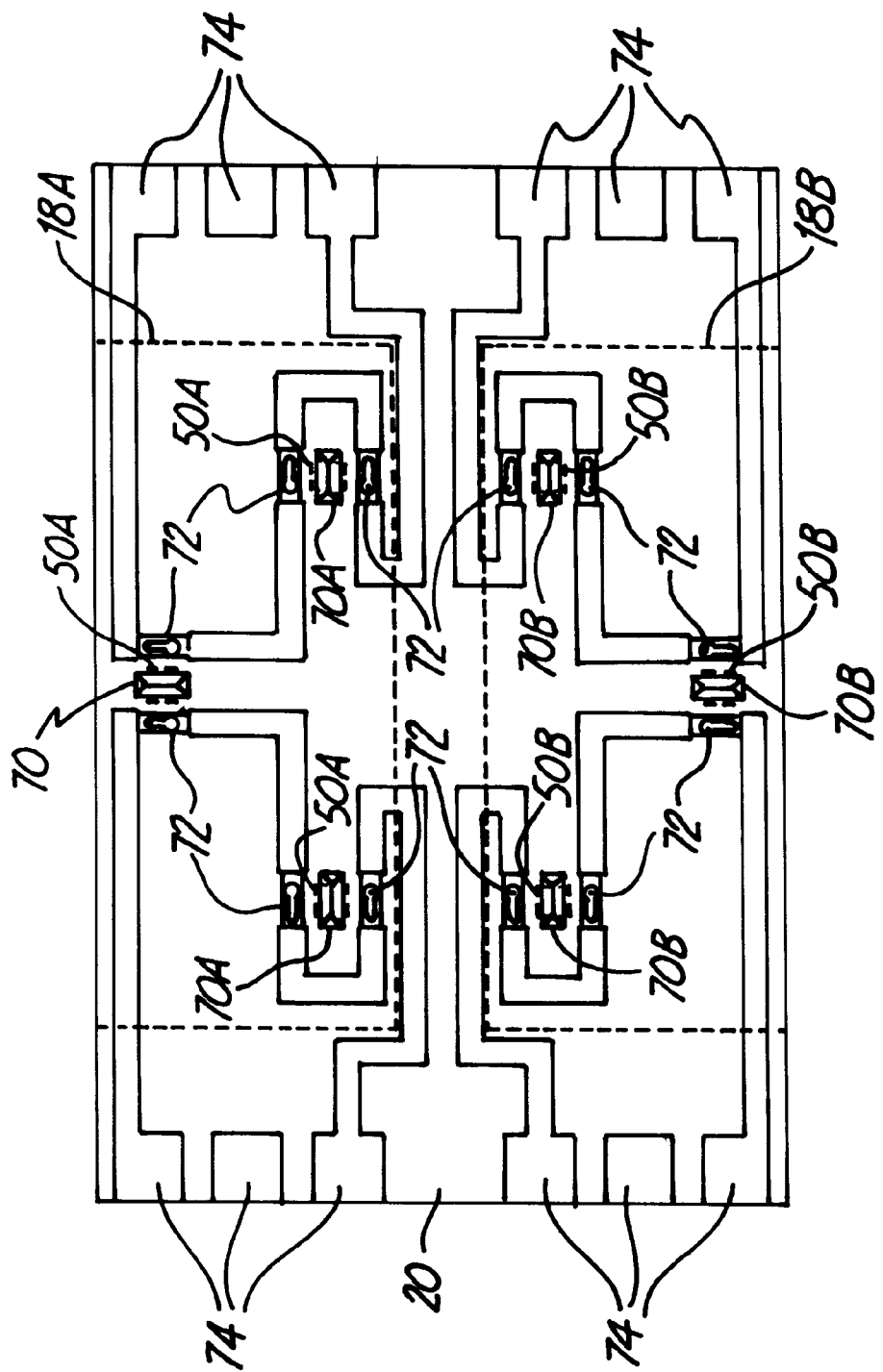
FIG. 5 is a top plan view of a fixed reference mount shown in FIG. 1.
Figure 7A:
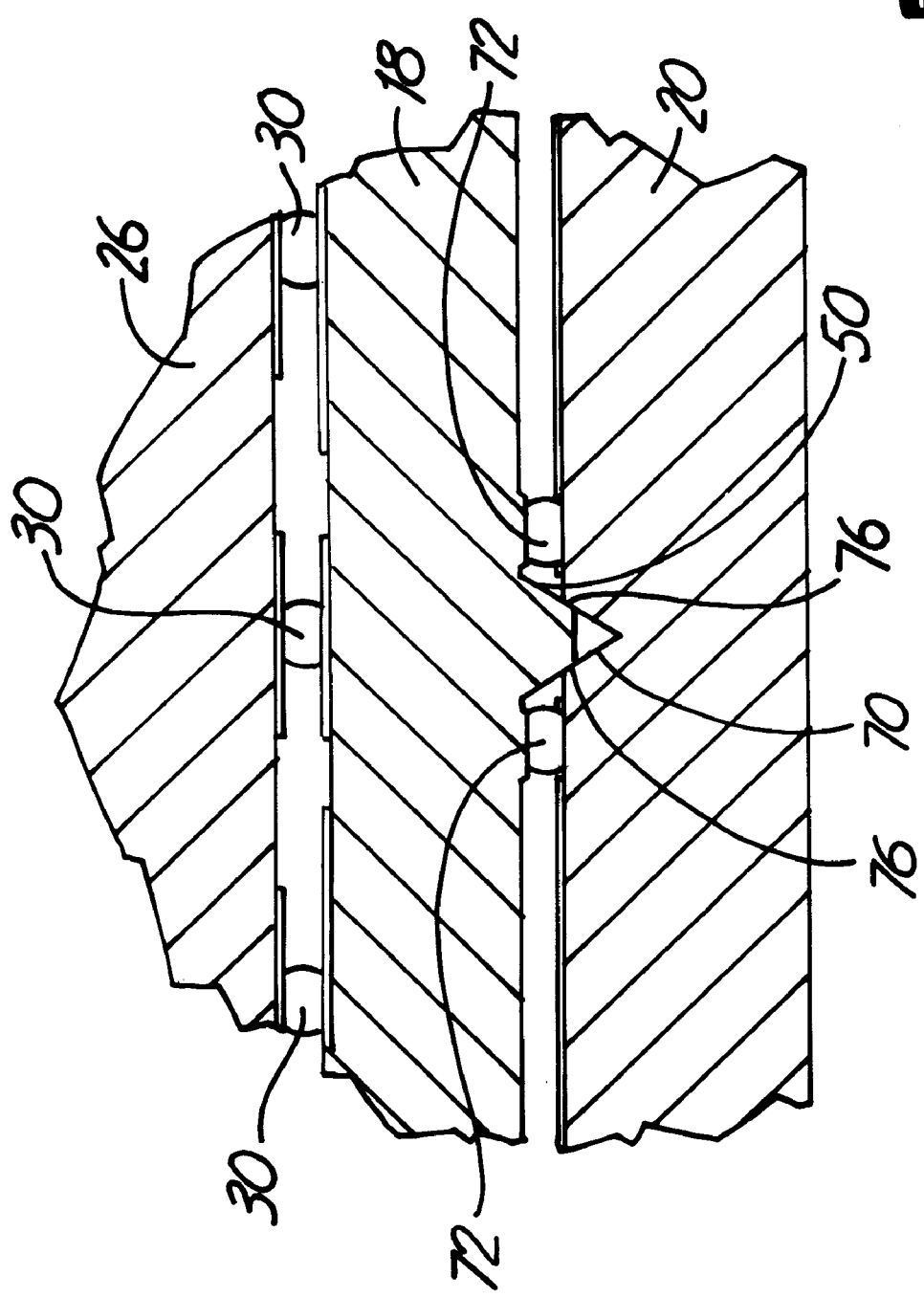
FIG. 7A is a cross-sectional view of registration features used to register the relative reference mount with a fixed reference mount shown in FIG. 1.

FIG. 5 is a top plan view of reference substrate 20 configured to receive optical modules 12A and 12B shown in FIG. 1. Registration features 70A and 70B are provided to receive registration features 50 on respective optical modules 12A and 12B. In the example embodiment, features 70 are precisely defined depressions configured to register the protrusions of registration features 50 shown in FIG. 3 or 4. This example embodiment is shown in FIG. 7A in more detail. The dashed outlines indicate the placement of base mounting plates 18A and 18B. This configuration provides an example of a kinematic-type registration or alignment technique. One example kinematic technique is described in U.S. Pat. No. 5,748,827, entitled "TWO-STAGE KINEMATIC MOUNT". Any appropriate registration or alignment technique can be used, however, preferably the registration technique should be accurate and provide high repeatability. In the example embodiment, a heat activated material 72 such as solder is provided which can be heated to fixedly adhere the optical modules to the reference substrate. In such an embodiment, contact pads 74 electrically couple to heaters which are used to heat material 72. Material 72 is preferably aligned with pads 54 shown in FIG. 4. For example, pads 54 can be of a material to which material 72 will strongly adhere. For example, pads 54 can comprise a metal to which solder will adhere. Pads used to promote adhesion can have multiple layers. For example, one layer to bond with the bonding material and another layer to bond with the mount, such as mounts 16, 18 or substrate 20.

Figure 6:
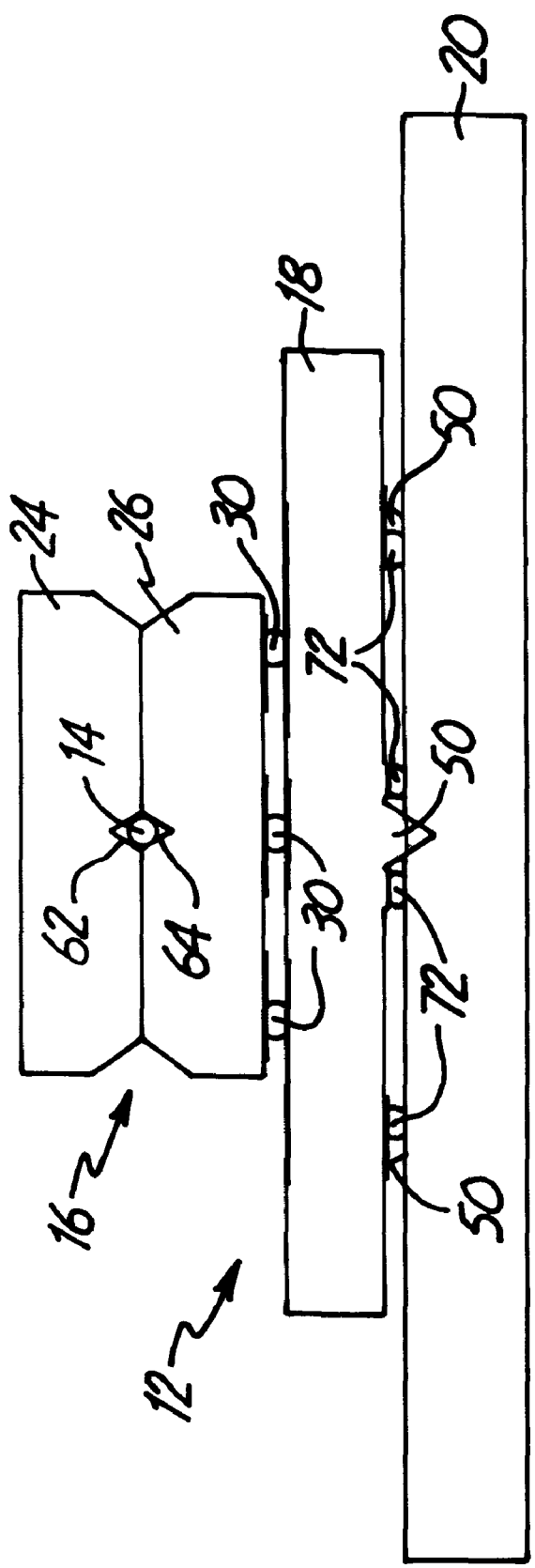
FIG. 6 is a cross-sectional view of the optical module of FIG. 4 taken along the line labeled 6—6.

FIG. 6 is a cross-sectional view showing optical module 12 mounted taken along the line labeled 6—6 in FIG. 4 and including substrate 20. This view shows the assembled configuration in which the optical module 12 is coupled to the reference substrate 20 and component holder 16 is coupled to base mounting plate 18.

Figure 7B:
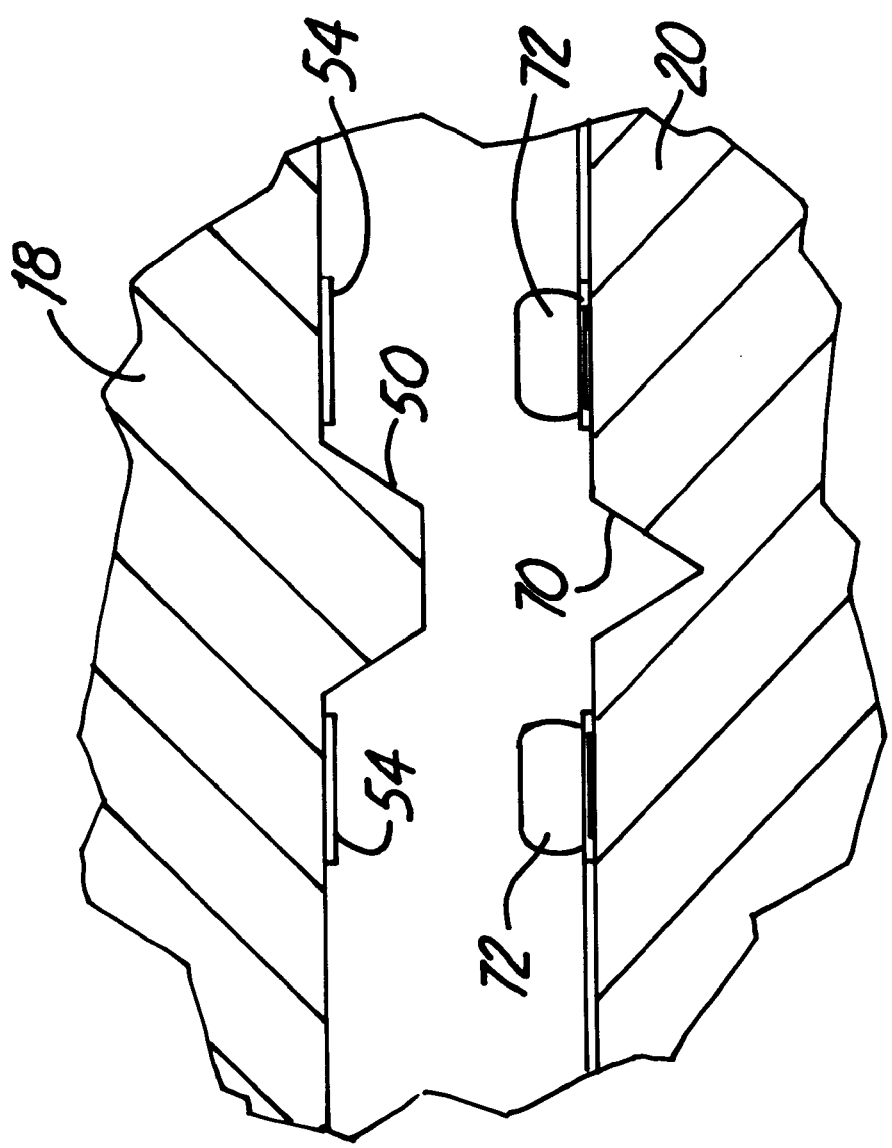
FIG. 7B is an exploded cross-sectional view of the registration features.

FIG. 7A is an enlarged cross-sectional and FIG. 7B is an enlarged exploded view showing v-groove registration feature 70 and protruding registration feature 50. The relative spacing between plate 18 and substrate 20 can be controlled by adjusting the angle or widths of the walls of v-groove 70 or of protrusion 50. If fabricated in properly oriented, single crystal silicon, the angle is typically fixed by the crystal structure of the material and the width can be adjusted to control the spacing. The coupling between plate 18 and substrate 20 actually occurs at line contact points 76.

Figure 8A:
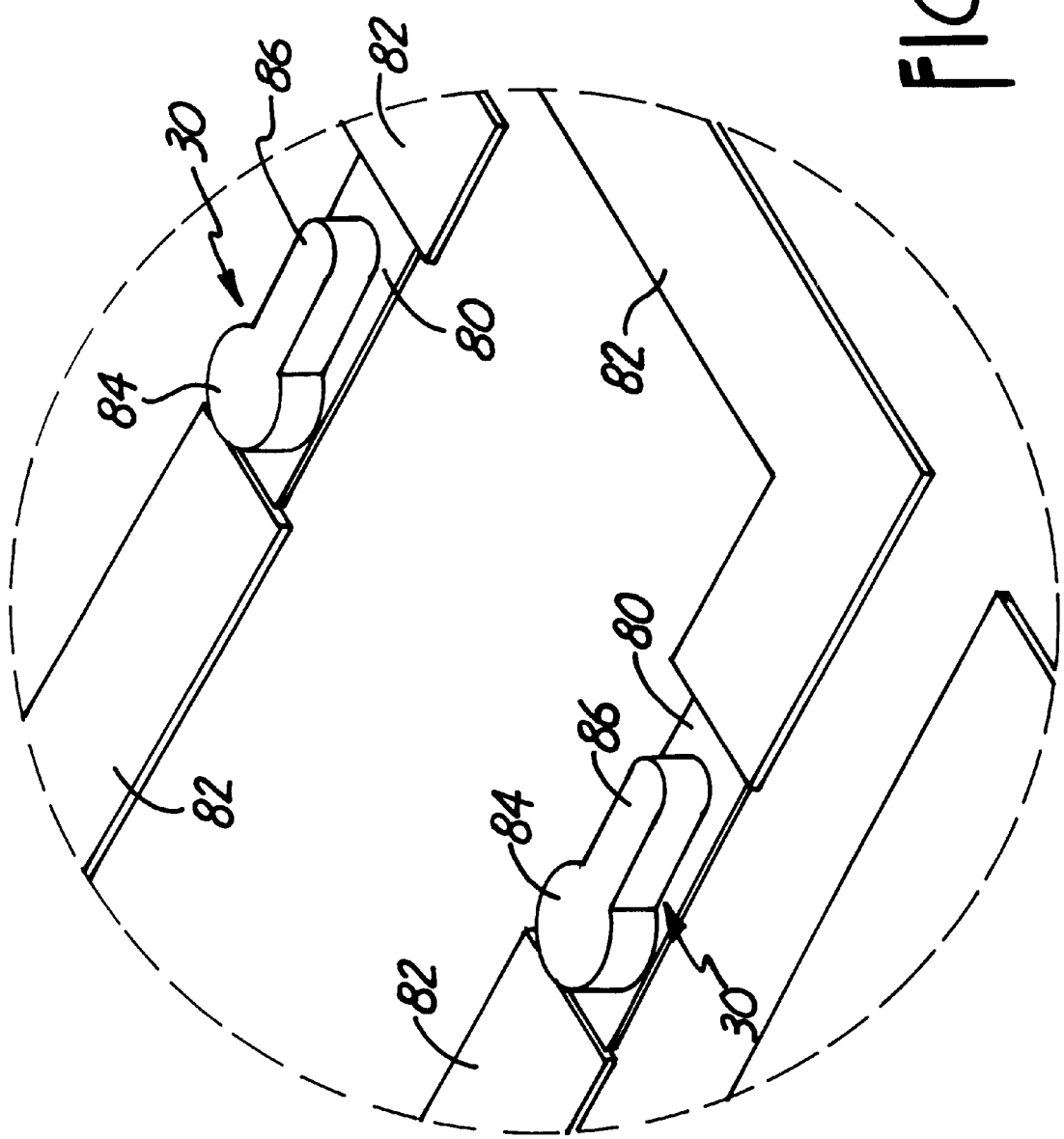
FIG. 8A is a perspective view showing bonding material used with the present invention.

FIG. 8A is a perspective view showing bonding material 30 in greater detail and FIG. 8B is a cross-sectional view showing bonding material 30 between lower component mount 26 and mounting plate 18. Bonding material 30 is carried on heating elements 80 which are electrically coupled to conductors 82. Heating elements 80 can comprise a resistive elements such as a refractory metal or alloy such as tantalum, chromium or nichrome and be configured to melt material 30 when sufficient electrical current is supplied through conductors 82.

The cross-sectional view shown in FIG. 8B illustrates the configuration near heating element 80. FIG. 8B is a diagram of thin film layers and is not to scale and shows features, such as contacts 34 which are remote from the heater element 80 and near the edge of mounting plate 18. Element 80 is shown electrically coupled to contacts 34 through electrical conductors 82. An electrical insulating layer 87 can optionally be positioned between element 80 and material 30 to increase the amount of electrical current flowing through element 80. Additional layer or layers 85 can be deposited on insulator 87 to promote adhesion or provide other characteristics or qualities as desired. This is known in the art of metal deposition as "under-bump metallurgy." Thermal (and/or electrical) isolation layers 89 can also be applied to reduce the transfer of thermal energy to the surrounding components. Preferably, heating element 80 is designed to operate in a thermally adiabatic regime. As current flows through the heating element 80 and it begins to warm, the thermal energy flows into the bonding material 30. Similarly, the structure preferably is configured to reduce heat flow into the surrounding areas. This reduces the energy required to activate the bonding material, reduces the heating and setting times and reduces the thermal stress applied to the surrounding material. Element 80 can have any appropriate shape including straight, bifilar, serpentine, etc. Solder provides a bonding material which can be quickly attached (in less than 100 mSec) and allows "reworking" the bond by reheating the solder.

The various materials can be selected as desired for the appropriate physical properties. SiO$_2$ provides good thermal and electrical isolation and is easily processed. Of course, other materials including other oxides or organic films can be used. The electrical isolation layer 87 is preferably relatively thin and provides high thermal conductivity. Silicon nitride is one example material. The conductors 82 can be any conductive material however, preferable materials include those which are easily deposited such as thick refractory metals, gold or aluminum. The material or materials for pads 54 can be any appropriate material which adheres to the bonding material 30. Examples include, titanium, gold, nickel, etc. The thickness of the various layers should also be selected to reduce the thermal load on the heating element. Pad 54 is shown with layers 54A and 54B. Layer 54A can be of a material suitable for bonding to thermal isolation layer 89. For example Ni if layer 89 is SiO$_2$. Layer 54B is configured to bonding with bonding material 30 and may be, for example, gold, nickel, titanium, or other materials.

Figure 8D:
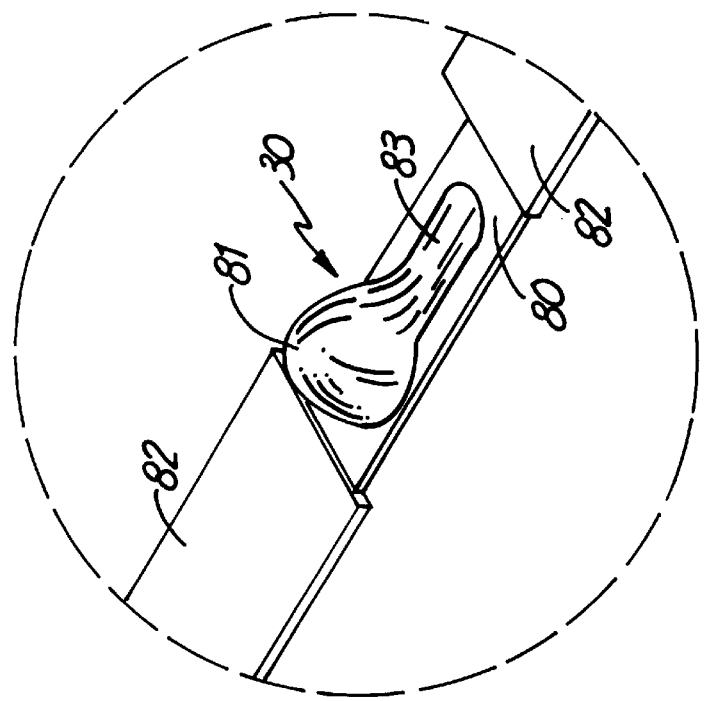
FIG. 8D is an enlarged view of the bonding material which illustrates deformation of the material after heating.
Figure 8C:
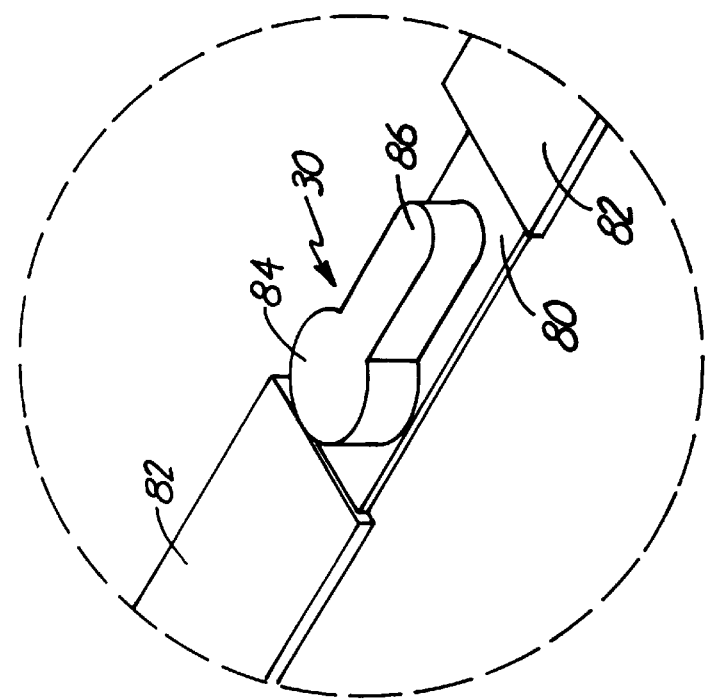
FIG. 8C is an enlarged view of the bonding material.

As shown in FIG. 8C, in one embodiment, material 30 comprises a solder formed with a large surface area region 84 and a tapered region 86. When material 30 is melted, surface tension causes the liquid material from tapered region 86 to flow toward large surface area region 84 and cause large surface area region 84 to expand in an upward direction as illustrated in FIG. 8D. This configuration is advantageous because it allows the orientation of component mount 16 to be adjusted as desired (through the six degrees of freedom as discussed with respect to FIG. 3) without any interference from the bonding material 30. Bonding material only contacts the two surfaces when heat is applied and the material fills the gap between the two components. Similarly, with respect to mounting base mounting plate 18 to reference substrate 20, plate 18 can be securely registered within feature 70 prior to application of the bonding material 72 or actuation of heating elements 80. Such a solder flow technique is described in U.S. Pat. No. 5,892,179, entitled "SOLDER BUMPS AND STRUCTURES FOR INTEGRATED REDISTRIBUTION ROUTING CONDUCTORS", issued Apr. 6, 1999 which is incorporated herein by reference.

As mentioned above, other bonding techniques including adhesives and UV curing techniques can be used and the invention is not limited to solder. However, in one aspect, the bonding technique can advantageously use the surface tension developed in the bonding material. Note that the solder or adhesive can be electrically conductive to provide electrical contacts to the optical device between the various layers, or to adjacent electronic circuitry. Thermally conductive materials can be used to help dissipate heat. In another aspect, two bonding materials are used, which can be the same or different and can be applied simultaneously or sequentially. For example, after the solder discussed herein is applied, a second bonding material can fill the gap to provide additional stability. However, shrinkage or other shape changes of the bonding material should be addressed to maintain alignment. In some embodiments, roughness or texturing the surfaces using any appropriate technique can be used to promote adhesion of the bonding material.

Component 14 can be any type of optical opto-electrical or opto-mechanical element including active or passive elements. In the above examples, optical element 14 is shown as an optical fiber. To illustrate one alternative example optical module 12, in FIGS. 9 and 10 an optical element 90 is shown which comprises a GRIN lens. FIG. 9 is a perspective view showing lens 90 held in component mount 16 which coupled to base mounting plate 18. FIG. 10 is a front plan view. Lens 90 is registered with a registration groove 60. Additional support bonding material 92 is provided to secure lens 90 to component mount 16. This can be an adhesive, solder or other bonding material.

The various components can be fabricated using any appropriate technique or material. In one embodiment, the depressions or grooves for various registration features are formed by anisotropically etching oriented single-crystal silicon. Protrusions can be formed in an analogous, complimentary manner. The configuration should preferably eliminate or substantially reduce movement in any of the six degrees of freedom. This is required to achieve sub-micron spacial reproducibility between components. For example, a [100] orientation of single crystal silicon allows the formation of such features which can be orientated at 90 degrees to one another. Any appropriate etching or formation technique can be used. One common anisotropic etch technique uses KOH and masking to define the desired features. Regarding the various conductive layers, heating element layers, and insulating layers, any appropriate sputtering, plating, evaporation or other fabrication technique can be used.

The various aspects of the present invention discussed above provide prealigned optical modules which can reduce or eliminate the effects of component variability. In the above example, this is achieved by adjusting the component mount (holder) relative to a registration feature on the base mounting plate. The bonding material fixes the relationship between the component and the registration feature. Precise registration features are provided on the base mounting plate 18 such that it can be inserted into an optical "circuit board" to fabricate devices which comprise multiple optical component modules. The optical modules are well suited for automated assembly of optical devices because they are in standardized packages, prealigned and can be easily mounted on a reference substrate. Optical modules can be manually placed into the optical "circuit board" or the process can be automated. The particular optical modules are preferably standardized to facilitate such automation. Further, this configuration allows assembly of devices in a "top downward" fashion in which optical modules are moved downward into an optical "circuit board" which facilitates process automation. Further, because different modules are fabricated using similar materials, variations due to thermal expansion will affect all modules in a similar way such that the alignment between adjacent modules on the optical "circuit board" is maintained.

Electrical conductivity of the solder bond can be used advantageously to provide an electrical connection to electrical components on the module. The solder can be heated in any order or combination including simultaneously. The position and sequence of the heating of the solder can be configured to reduce or compensate for deformation in the components including thermal deformation. Solder can also be used advantageously because the solder can be reheated allowing the component to be repositioned, removed, replaced, and/or repaired.

In one general aspect, the present invention provides an optical device comprising a plurality of optical modules in which optical variations due to component variability are eliminated or significantly reduced. This provides uniformity across multiple optical modules which is particularly desirable for automated assembly. In one aspect, the invention can be viewed as providing three stages of alignment between the optical component and the optical component mount. A first stage of alignment is provided between the component mount (holder) and the optical component, for example using a V-groove registration feature as shown or other technique. A second stage of alignment is between the optical component mount and registration features of the relative reference mount. This also eliminates or reduces alignment variations due to component variability. A final alignment occurs between the optical module and the reference substrate. In another example aspect, the optical element has an optical characteristic which varies in space relative to at least one dimension. The optical component is aligned with reference features on the relative reference mount by fixing the position of the component mount relative to the registration features of the relative reference mount to thereby align the optical characteristic. In one aspect, the first stage of alignment is eliminated and the optical element is directly aligned with the registration features of the relative reference mount and no mount/holder is used.

Although the present invention has been described with reference to preferred embodiments, workers skilled in the art will recognize that changes may be made in form and detail without departing from the spirit and scope of the invention. For example, the number of solder, heater, and receiver sets may be altered depending on detailed requirement. The sequence of reflowing the solder may be altered to enhance stability. For example, entire multimodule assemblies can be arranged on an optical "circuit board" to fabricate a complex opto-electronic assembly. The optical component can be any type of active or passive optical, opto-electrical or opto-mechanical component and not limited to the specific examples set forth herein. The optical component can be aligned and its orientation fixed using any suitable or desirable means. The specific components and examples set forth herein are provided to demonstrate various aspects of the invention and do not limit the scope of the invention. Other elements, shapes, components, configurations, etc. are within the scope of the invention. Any appropriate registration technique that provides the desired amount of constraint. Preferably, the registration technique is highly repeatable and accurate in all six degrees of freedom. Any appropriate material can be used for the various components. In one specific aspect, the relative reference mount and other components are formed from a single crystal material such as silicon. In another aspect, these components can be fabricated from any electrical material including semiconductors or ceramics. Other materials include machinable materials such as steel, aluminum, metal alloys, etc. depending on requirements of a particular implementation. An assembled optical module can be used to fabricate an optical device using a "pick and place" machine or any suitable or desirable means. In such an embodiment, the chamfers or bevels on the edges of the component mount can facilitate mechanical gripping of the mount. Similarly, the various components of the invention can be fabricated using any desired technique. Solders are known in the art and any appropriate solder can be selected to obtain the desired characteristics. The optical component can be coupled directly to the relative reference mount without a separate component mount. As used herein, "light" is not necessarily visible light. Further, the optical component can be any active or passive optical, opto-electrical or opto-mechanical element. Although only two modules are shown in the example optical device, any number of modules can be used in the device. The optical modules can be prealigned using any appropriate technique for example, the techniques set forth in U.S. patent application Ser. No. 09/789,317, filed Feb. 20, 2001 and entitled "OPTICAL ALIGNMENT SYSTEM". In an example alternative, the alignment is performed in situ, after the optical module or relative reference mount has been mounted to the optical "circuit board".

What is claimed is:

1. An optical device, comprising:
   a fixed reference mount having a first registration feature and a second registration feature;
   a first optical module comprising:
      an optical component having an optical characteristic which varies based upon a position of the optical component in space relative to at least one dimension and wherein component variability causes a variability in the optical characteristic;
      a relative reference mount including a registration feature having a three dimensional shape configured to align with the first registration feature of the fixed reference mount wherein the alignment between the relative reference mount and the fixed reference mount is repeatable in six degrees of freedom on the fixed reference mount, the optical component held at a prealigned spacial orientation relative to the registration feature to adjust for the variability in the optical characteristic of the optical component prior to placing the relative reference mount in the fixed reference mount whereby the optical component is fixed in six degrees of freedom relative to the registration feature of the relative reference mount; and
   a second optical module, comprising:
      an optical component having an optical characteristic which varies based upon a position of the optical component in space relative to at least one dimension and wherein component variability causes a variability in the optical characteristic; and
      a relative reference mount including a registration feature having a three dimensional shape configured to align with the second registration feature of the fixed reference mount wherein the alignment between the relative reference mount and the fixed reference mount is repeatable in six degrees of freedom on the fixed reference mount, the optical component held at a prealigned spacial orientation relative to the registration feature to adjust for the variability in the optical characteristic of the optical component prior to placing the relative reference mount in the fixed reference mount whereby the optical component is fixed in six degrees of freedom relative to the registration feature of the relative reference mount.

2. An optical device of claim 1 including optical component mounts configured to fixedly couple to the optical components.

3. The optical device of claim 1 including bonds configured to fixedly couple the optical components relative to the relative reference mounts.

4. The optical device of claim 1 wherein the first and second optical modules are bonded to the fixed reference mount by a bond.

5. The optical device of claim 4 wherein the bond comprises solder.

6. The optical device of claim 4 wherein the bond is heat activated.

7. The optical device of claim 4 wherein the fixed reference mount includes a heater element configured to heat the bond.

8. The optical device of claim 7 wherein the heater element comprises a resistive element.

9. The optical device of claim 7 including contact pads on the fixed reference mount electrically connected to the heater element.

10. The optical device of claim 4 wherein the bond is activated by radiation.

11. The optical device of claim 1 wherein at least one optical element has an optical characteristic which varies relative to at least one dimension and wherein the optical characteristic is aligned with a reference defined relative to a registration feature of the respective relative reference mount.

12. The optical device of claim 11 wherein the optical components of the optical modules are aligned with each other.

13. The optical device of claim 1 wherein the fixed reference mount registration features are positioned to provide alignment between the first and second optical modules.

14. The optical device of claim 1 wherein the registration features of the relative reference mounts comprise protrusions.

15. The optical device of claim 14 wherein the first and second registration features of the fixed reference mount comprise recesses configured to mate with the protrusions.

16. The optical device of claim 1 wherein the registration features provide a substantially kinematic mount.

17. The optical device of claim 1 wherein the fixed reference mount comprises silicon.

18. The optical device of claim 1 wherein the relative reference mounts comprise silicon.

19. The optical device of claim 1 wherein the fixed reference mount comprises a semiconductor.

20. The optical device of claim 1 wherein the fixed reference mount comprises a ceramic.

21. The optical device of claim 1 wherein the optical device comprises a fiber to fiber coupler.

22. The optical device of claim 3 wherein the bond comprises solder.

23. The optical device of claim 3 wherein the bond maintains a fixed spacial orientation between the optical component mounts and the respective relative reference mounts.

24. The optical device of claim 3 wherein the bond has a first state in which a position of an optical component can be adjusted and a second state in which the position is fixed.

25. The optical device of claim 1 wherein the relative reference mounts are substantially planar.

26. The optical device of claim 4 including a bonding pad between the relative reference mounts and the fixed reference mount configured to adhere to the bond.

27. The optical device of claim 2 wherein the optical component mounts include registration features configured to register the respective optical components.

28. The optical device of claim 2 wherein the optical component mounts include interface surfaces and the optical components are flush with the respective interface surfaces.

29. The optical device of claim 1 including at least one additional optical module.

30. An optical device, comprising:
a fixed reference mount having first and second registration features;
a first optical module comprising:
an optical component having an optical characteristic which varies based upon a position of the optical component in space relative to at least one dimension and wherein component variability causes a variability in the optical characteristic;
a relative reference mount having a registration feature with a three dimensional shape configured to align with the first registration feature of the fixed reference mount wherein the alignment between the relative reference mount and the fixed reference mount is repeatable in six degrees of freedom on the fixed reference mount;
a fixed relative spacial orientation between the optical component and the registration feature of the relative reference mount to adjust for the variability in the optical characteristic of the optical component prior to placing the relative reference mount in the fixed reference mount whereby the optical component is fixed in six degrees of freedom relative to the registration feature of the relative reference mount;
a second optical module comprising:
an optical component having an optical characteristic which varies based upon a position of the optical component in space relative to at least one dimension and wherein component variability causes a variability in the optical characteristic;
a relative reference mount having a registration feature with a three dimensional shape configured to align with the second registration feature of the fixed reference mount wherein the alignment between the relative reference mount and the fixed reference mount is repeatable in six degrees of freedom on the fixed reference mount; and
a fixed relative spacial orientator between the optical component and the registration feature of the relative reference mount to adjust for variability in the optical characteristic of the optical component prior to placing the relative reference mount in the fixed reference mount whereby the optical component is fixed in six degrees of freedom relative to the registration feature of the relative reference mount.

31. An optical device of claim 30 including optical component mounts configured to fixedly couple to the optical components.

32. The optical device of claim 31 including a bond configured to fixedly couple the optical component mounts to the relative reference mounts.

33. The optical device of claim 30 wherein the first and second optical modules are bonded to the fixed reference mount by a bond.

34. The optical device of claim 33 wherein the bond comprises solder.

35. The optical device of claim 33 wherein the bond is heat activated.

36. The optical device of claim 33 wherein the fixed reference mount includes a heater element configured to heat the bond.

37. The optical device of claim 36 wherein the heater element comprises a resistive element.

38. The optical device of claim 36 including contact pads on the fixed reference mount electrically connected to the heater element.

39. The optical device of claim 33 wherein the bond is activated by radiation.

40. The optical device of claim 30 wherein at least one optical element has an optical characteristic which varies relative to at least one dimension and wherein the optical characteristic is aligned with a reference defined relative to a registration feature of the respective relative reference mount.

41. The optical device of claim 40 wherein the optical components of the optical modules are aligned with each other.

42. The optical device of claim 30 wherein the registration features of the relative reference mounts comprise protrusions.

43. The optical device of claim 42 wherein the first and second registration features of the fixed reference mount comprise recesses configured to mate with the protrusions.

44. The optical device of claim 30 wherein the registration features provide a substantially kinematic mount.

45. The optical device of claim 30 wherein the fixed reference mount comprises silicon.

46. The optical device of claim 30 wherein the relative reference mounts comprise silicon.

47. The optical device of claim 30 wherein the fixed reference mount comprises a semiconductor.

48. The optical device of claim 30 wherein the fixed reference mount comprises a ceramic.

49. The optical device of claim 30 wherein the optical device comprises a fiber to fiber coupler.

50. The optical device of claim 32 wherein the bond comprises solder.

51. The optical device of claim 32 wherein the bonds provide gaps between the optical component mounts and the respective relative reference mounts.

52. The optical device of claim 32 wherein the bond has a first state in which a position of an optical component can be adjusted and a second state in which the position is fixed.

53. The optical device of claim 30 wherein the relative reference mounts are substantially planar.

54. The optical device of claim 33 including a bonding pad between the relative reference mounts and the fixed reference mount configured to adhere to the bond.

55. The optical device of claim 31 wherein the optical component mounts include registration features configured to register the respective optical components.

56. The optical device of claim 30 wherein the optical component mounts include interface surfaces and the optical components are flush with the respective interface surfaces.

57. The optical device of claim 30 wherein the fixed reference mount registration features are positioned to provide alignment between the first and second optical modules.

58. The optical device of claim 30 including at least one additional optical module.

59. An optical device, comprising:
a fixed reference mount having a first registration feature and a second registration feature;
a first optical module comprising:
an optical component having an optical characteristic which varies based upon a position of the optical component in space relative to at least one dimension and wherein component variability causes a variability in the optical characteristic;
a relative reference mount including a registration feature having a three dimensional shape configured to align with the first registration feature of the fixed reference mount, the registration features providing a substantially kinematic mount to fix the relative reference mount wherein the alignment between the relative reference mount and the fixed reference mount is repeatable in six degrees of freedom on the fixed reference mount and the optical component is prealigned to the registration feature of the relative reference mount to adjust for the variability in the optical characteristic of the optical component prior to placing the relative reference mount in the fixed reference mount whereby the optical component is fixed in six degrees of freedom relative to the registration feature of the relative reference mount; and
a second optical module, comprising:
an optical component; and
a relative reference mount including a registration feature having a three dimensional shape configured to align with the second registration feature of the fixed reference mount, the registration features providing a substantially kinematic mount to fix the relative reference mount wherein the alignment between the relative reference mount and the fixed reference mount is repeatable in six degrees of freedom on the fixed reference mount and the optical component is prealigned to the registration feature of the relative reference mount to adjust for the variability in the optical characteristic of the optical component prior to placing the relative reference mount in the fixed reference mount whereby the optical component is fixed in six degrees of freedom relative to the registration feature of the relative reference mount.

60. The optical device of claim 59 including optical component mounts configured to fixedly couple to the optical components.

61. The optical device of claim 60 including a bond configured to fixedly couple the optical component mounts to the relative reference mounts.

62. The optical device of claim 59 wherein the first and second optical modules are bonded to the fixed reference mount by a bond.

63. The optical device of claim 62 wherein the bond comprises solder.

64. The optical device of claim 62 wherein the bond is heat activated.

65. The optical device of claim 62 wherein the fixed reference mount includes a heater element configured to heat the bond.

66. The optical device of claim 65 wherein the heater element comprises a resistive element.

67. The optical device of claim 65 including contact pads on the fixed reference mount electrically connected to the heater element.

68. The optical device of claim 59 wherein the optical components of the optical modules are aligned with each other.

69. The optical device of claim 59 wherein the registration features of the relative reference mounts comprise protrusions.

70. The optical device of claim 69 wherein the first and second registration features of the fixed reference mount comprise recesses configured to mate with the protrusions.

71. The optical device of claim 59 including at least one additional optical module.

72. The optical device of claim 1 wherein the fixed reference mount comprises a substrate.

73. The optical device of claim 3 wherein the bond comprises a weld.

74. The optical device of claim 4 wherein the bond comprises adhesive.

75. The optical device of claim 30 wherein the fixed reference mount comprises a substrate.

76. The optical device of claim 33 wherein the bond comprises a weld.

77. The optical device of claim 33 wherein the bond comprises adhesive.

78. The optical device of claim 59 wherein the fixed reference mount comprises a substrate.

79. The optical device of claim 61 wherein the bond comprises a weld.

80. The optical device of claim 62 wherein the bond comprises adhesive.

* * * * *